United States Patent [19]
Osterweil

[11] Patent Number: 5,317,604
[45] Date of Patent: May 31, 1994

[54] ISOCHRONOUS INTERFACE METHOD

[75] Inventor: Josef Osterweil, Rockville, Md.

[73] Assignee: GTE Government Systems Corporation, Waltham, Mass.

[21] Appl. No.: 999,477

[22] Filed: Dec. 30, 1992

[51] Int. Cl.⁵ .................... H04B 1/66; H04J 15/00
[52] U.S. Cl. ............................. 375/122; 370/118
[58] Field of Search ............. 375/122, 118; 370/118; 358/133, 426, 430; 381/29

[56] References Cited

U.S. PATENT DOCUMENTS

| | | | |
|---|---|---|---|
| 4,596,026 | 6/1986 | Cease et al. .................... | 375/118 |
| 5,159,447 | 10/1992 | Haskell et al. ................. | 358/133 |
| 5,172,228 | 12/1992 | Israelsen ........................ | 358/133 |

OTHER PUBLICATIONS

Zdepski et al., "Statistically Based Butter Control Polices per Constant Rate Transmission of Compressed Digital Video", Jun. 1991, IEEE Transactions on Communications, vol. 39 No. 6, pp. 947-957.

*Primary Examiner*—Stephen Chin
*Assistant Examiner*—Duane Kobayashi
*Attorney, Agent, or Firm*—J. Stephen Yeo

[57] ABSTRACT

Method of transferring isochronous data from a source over a clocked channel to a sink. The data is compressed by a compression ratio responsive to a depth of a first variable stack. The compressed data is stored in the first stack and clocked by the channel. Compressed data on the channel is expanded and stored in a second variable stack. The variable stack is clocked to maintain the second variable stack at a constant depth.

1 Claim, 5 Drawing Sheets

ISOCHRONOUS INTERFACE METHOD

RELATED COPENDING APPLICATION

U.S. patent application Ser. No. 07/999,476, filed Dec. 30, 1992, for Isochronous Interface Apparatus is concerned with an apparatus related to the method of the present invention.

BACKGROUND OF THE INVENTION

This invention pertains to digital communications and more particularly is concerned with isochronous channel interfaces.

Digital communications isochronous channel interfaces offer the capability of adapting, at the channel input, data from a source that is not synchronized to the channel and restoring the data, at the channel output, to its original condition. A typical source is telemetry that is generating a continuous data stream timed independently of the channel clock source and that is often unstable with momentary rate perturbations. To be successful, the source data rate must be lower than the channel traffic rate. One technique employs stuff bits to fill the gap between the rates. The stuff bits are identified and discarded during data recovery at the channel output. Channel traffic rates are available in discrete increments and force the system designer to the next available increment above the telemetry data rate, thus often causing costly overhead.

Consider an interface between two networks wherein one network has a clearly specified frequency reference but the other network does not. The timing characteristic of the second network is unknown. The interface should accommodate any timing condition, including unpredictable drift. Since the data is not digitized analog where resampling is a solution, an isochronous process is required.

Two current techniques to accommodate an isochronous interface are bit stuffing and oversampling. Both techniques require that the source data rate be lower than the channel traffic rate. The difference between the data rate and the channel rate is called the overhead. The bit stuffing approach requires moderate overhead of 10 to 20%. The overhead is used for framing of the data and for identification of the stuff bits so that they can be removed accurately at the channel output. The actual overhead is often higher since many networks and components have incremental channel traffic rate configuration capability.

For example, consider a 64 kbps ±5% data rate to be interfaced to an ISDN channel. A 20% framing and bit stuffing overhead would raise the required channel traffic rate to 80 kbps. However, the next incremental traffic rate available on the ISDN channel is 128 kbps, therefore 100% overhead is incurred.

The oversampling technique is effective for very low rate data streams since the data is sampled at several times the data rate. The transitions of the data are sensed and transmitted for reconstruction at the output of the channel. This technique is very high in overhead and appends an inherent jitter onto the reconstructed data.

SUMMARY OF THE INVENTION

Briefly, according to one aspect of the invention, there is provided a method of transferring isochronous data from a source over a clocked channel to a sink. The data is compressed by a compression ratio responsive to a depth of a first variable stack. The compressed data is stored in the first stack and clocked by the channel. Compressed data on the channel is expanded and stored in a second variable stack. The variable stack is clocked to maintain the second variable stack at a constant depth.

DETAILED DESCRIPTION OF THE PREFERRED EMBODIMENTS

Figure 1:
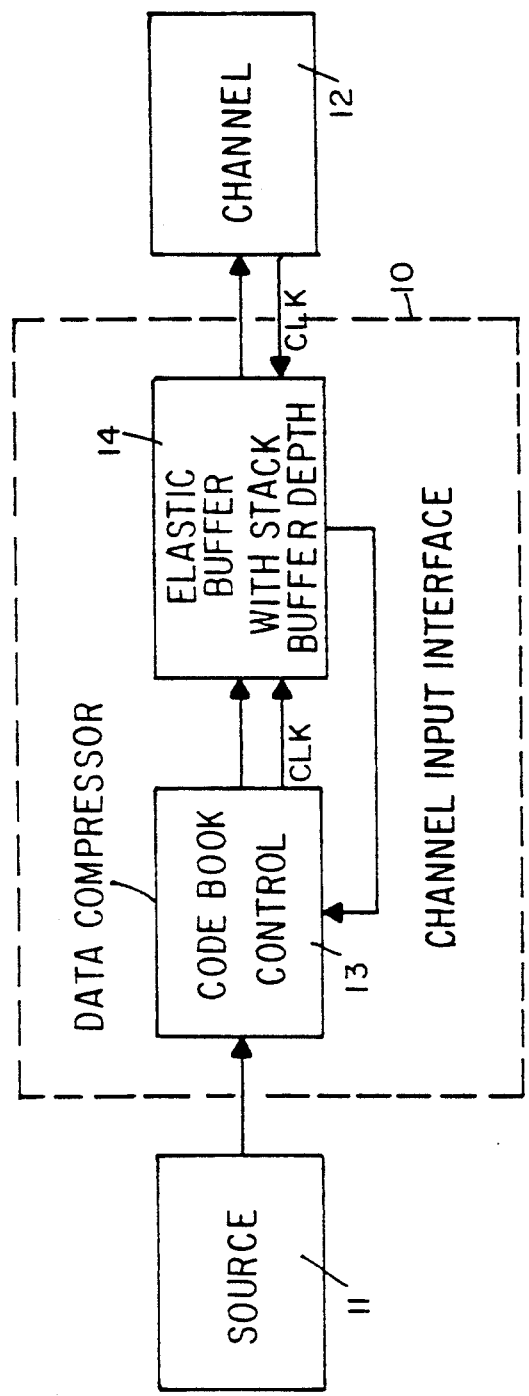
FIG. 1 is a block diagram of the channel input interface.

An isochronous interface occurs when the the source data is not the same as the channel rate. Isochronous interface apparatus transfer data from a source over a clocked channel to a destination.

The invention implements a technique that uses a controllable compression scheme for matching data rate to channel traffic rate where no stuff bits are used. Alternately, lossless compression can be used in conjunction with stuff bits. In either case, this technique requires no additional bandwidth for overhead functions.

The technique, due to compression, reduces the data rate to ensure that it is within channel capacity. Statistical characteristics of the data determine the achievable compression and efficiency. A feature of the invention is the use of compression as part of isochronous interface in general and the use of controlled compression for data flow control in particular.

Compression for the purpose of bandwidth reduction is an established art. The common objective of data compression is to minimize bandwidth by maximizing the compression ratio. Planned reduction of compression ratio is considered counterproductive in the art.

For data payload, low error tolerance is assumed at the destination. The objective may be illustrated by the example mentioned in the previous section. A 64 kbps±5% data rate is to be interfaced isochronously to a 64 kbps nominal rate ISDN channel. This is accomplished by compressing the payload data at the sending interface. The compression must be lossless so that the data can be fully recovered by an expansion process at the receiving interface. The compression ratio must be sufficient for the payload data to fit the 64 kbps channel. As a feature of the invention the degree of compression is regulated so that the payload data rate exactly matches the channel rate.

Unlike voice, image, or video, the fidelity of data is critical and must, therefore, use lossless compression methods. Lossless compression of data can strive to reach the data entropy rate at which point further compression will introduce distortion. The degree of lossless compression is therefore data dependent. Data that has already been compressed to the entropy rate cannot undergo further lossless compression.

A number of lossless compression methods have been developed. Many of these lossless compression methods require statistical knowledge of the data source. Such is the case with the widely used Huffman code which requires advanced knowledge of the probability associated with the different data phrases. This statistical information may not be easily attainable, particularly in case of unpredictable data sources. There are dynamic compression methods that derive coding from the data on the fly and do not require an a priori knowledge of the statistical parameters of the data. These codes are often referred to as Universal Source Codes, which include the Lampel-Ziv (LZ) code. The LZW code, an improved version of the LZ code, is widely used for data compression and has proven to be both practical and effective in approaching the entropy rate. The L-Z code is preferred, however a variety of compression codes can be selected for the isochronous interface application.

The LZ code is based on source data parsing into phrases of increasing length. These phrases are placed in a code book in a systematic manner at the encoder. An identical code book is simultaneously produced at the decoder using the same LZ rules. As the code book increases, the compression rate, i.e., coding efficiency, increases. Buildup of the code book can be discontinued and resumed at will. Furthermore, its use can be restricted arbitrarily to a reduced code span. By controlling code book expansion and/or changing the accessible code book span, the compression ratio is controlled. Isochronous interface apparatus transfers data from a source over a clocked channel to a destination.

A block diagram of the channel input interface 10 is shown in FIG. 1. Channel input interface 10 is interposed between the source 11 and the channel 12. Channel input interface 10 includes a data compressor 13 adapted to compress the data with a compression ratio responsive to a signal. A first elastic buffer 14 is coupled between the data compressor 13 and the channel 14, having a first variable stack and providing a first signal representing the depth of the first variable stack. Buffer 14 is clocked by channel 12 and provides a signal representing the depth of the variable stack. The first signal is feedback to data compressor 13 for controlling the compression ratio of the data compressor 13.

The instantaneous degree of compression is variable due to the statistical properties of smooth compression. A signal representing the depth of the data stack in the elastic buffer 14 is used to control the compression ratio. As the content of buffer 14 grows or shrinks, compression is correspondingly accelerated or decreased by the signal from the elastic buffer 14.

Buffer depth readout is used to control the compression ratio by code book table expansion and access manipulation of clock signals. This technique can be used in conjunction with bit stuffing for extreme cases where data redundancy is very high. In such cases, a high degree of compression occurs with minimal table buildup.

Figure 2:
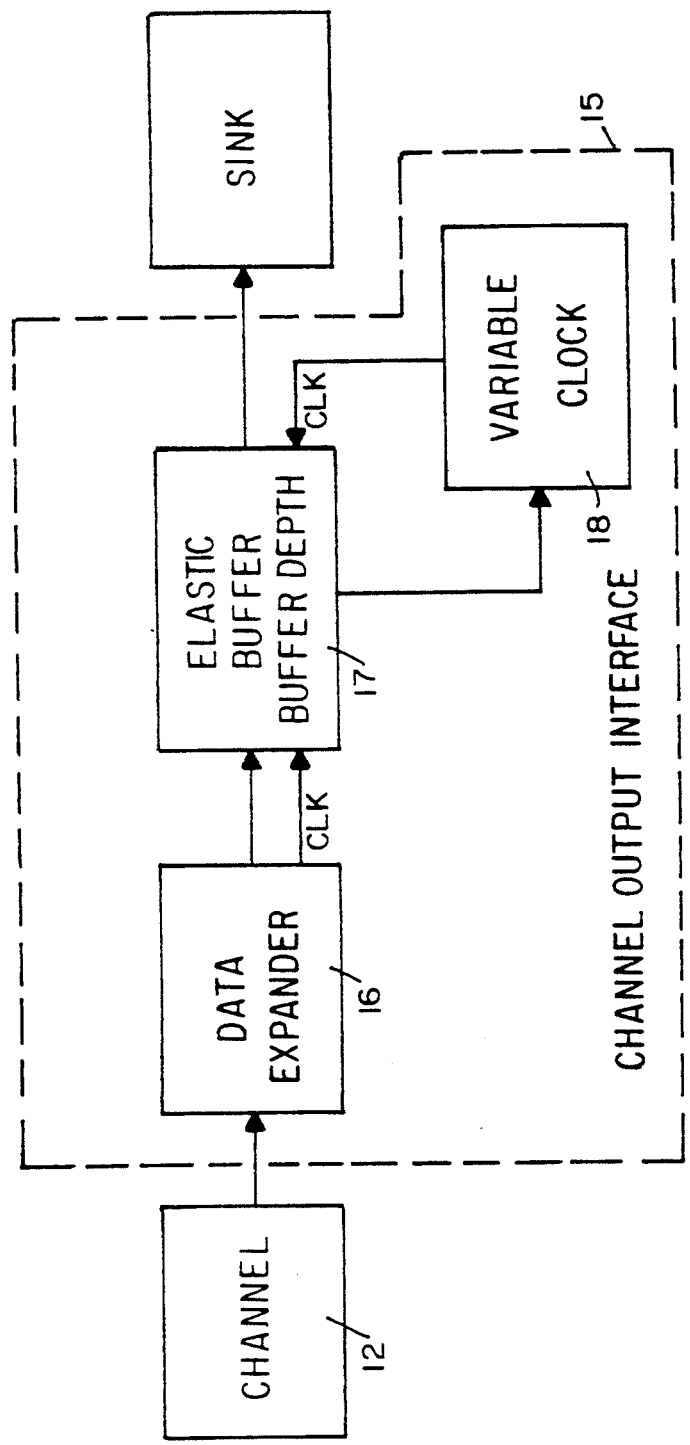
FIG. 2 is a block diagram of the channel output interface at the destination.

FIG. 2 shows the block diagram of the channel output interface 15 at the sink 16 or destination. Channel output interface 15 includes a data expander 16 coupled to the channel. A second elastic buffer 17 is coupled between data expander and the sink 16 or destination, and has a second variable stack. Second elastic buffer 17 provides a second signal representing the depth of the second variable stack. A variable clock 18 is responsive to the second signal and is adapted to maintain the second variable stack at a constant depth.

A data expander, e.g. a LZ decoder is coupled to the channel. The data expander, e.g. LZ decoder, must follow the coded instructions from the data compressor, e.g, LZ encoder, and is therefore not controlled by a signal from the elastic buffer as is the data compressor. The elastic buffer is part of the clock recovery mechanism used for the reconstructed data stream. Variable clock 18 is controlled by the second signal representing the depth of the data stack in the second elastic buffer. A constant data stack depth maintained in the second elastic buffer the recovered clock is an exact reproduction of the original clock at the data source. Jitter and other data rate short term perturbations are not reproduced.

Figure 3:
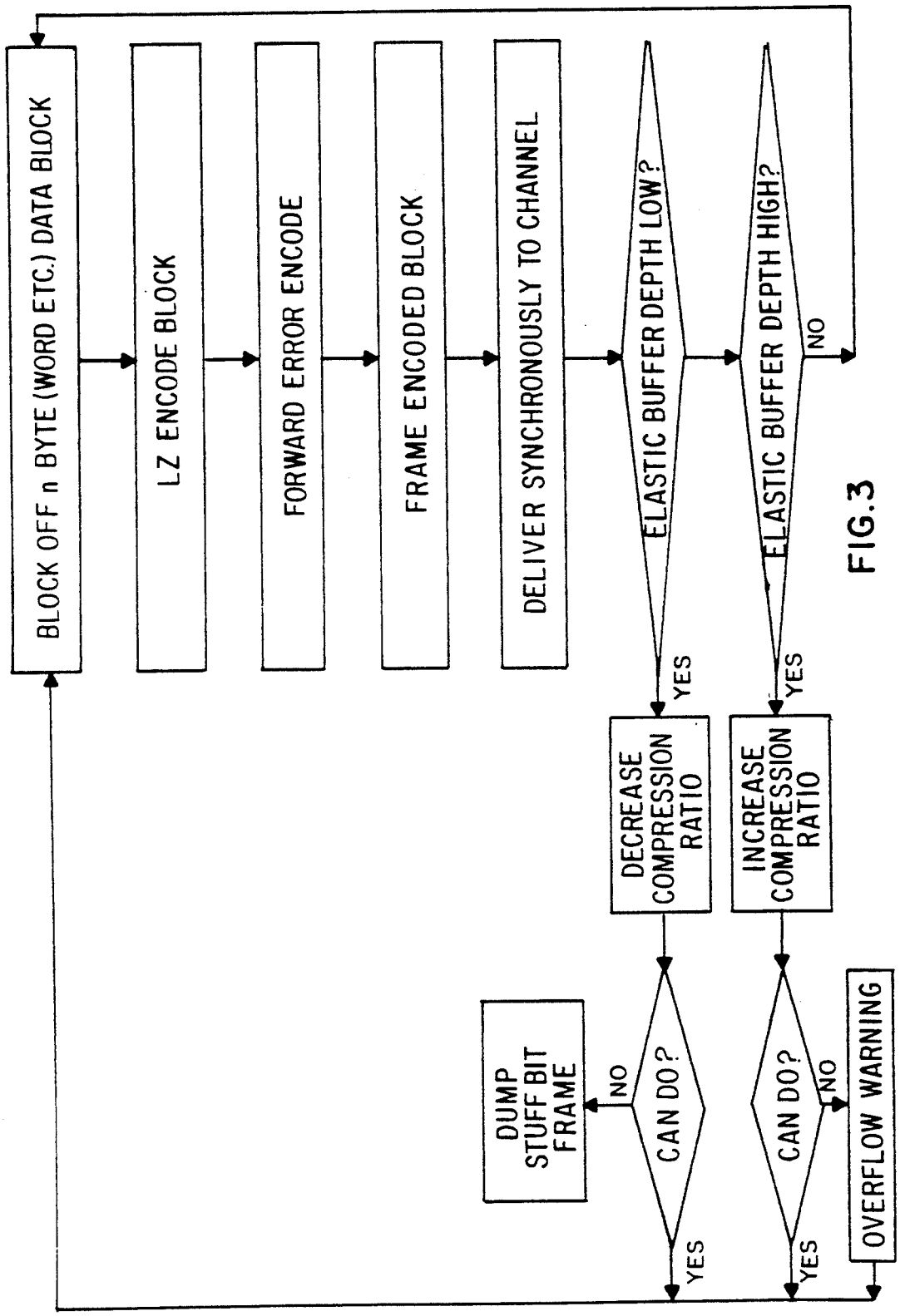
FIG. 3 is a flow diagram illustrating the method of the invention.

FIG. 3 is a flow diagram illustrating the method of the invention, wherein isochronous data from a source is transferred over a clocked channel to a designation. The data is compressed by a compression ratio responsive to a depth of a first variable stack. The compressed data is stored in the first stack and clocked by the channel. Compressed data on the channel is expanded and stored in a second variable stack. The variable stack is clocked to maintain the second variable stack at a constant depth.

The compressed data is sensitive to channel errors. Code with errors will point to the wrong phrase in the code book and will result in error burst as well as bit slips.

Figure 4:
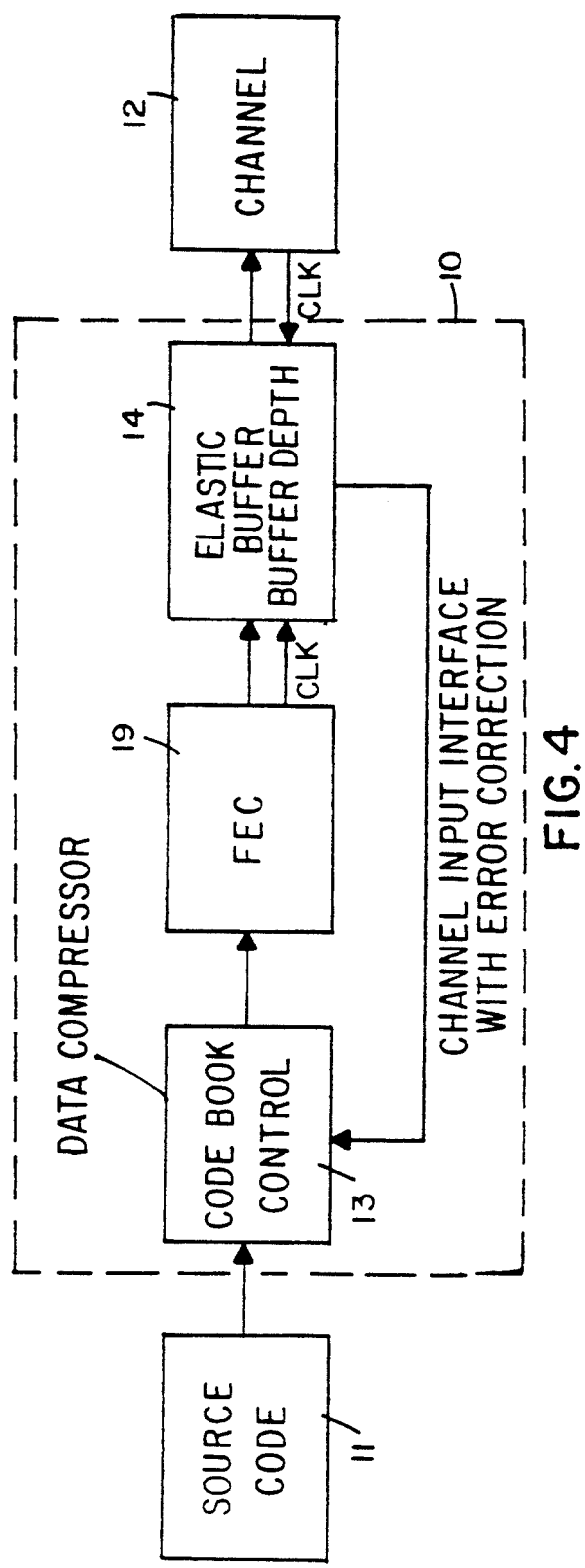
FIG. 4 is a block diagram of an error correcting implementation at the channel input interface.
Figure 5:
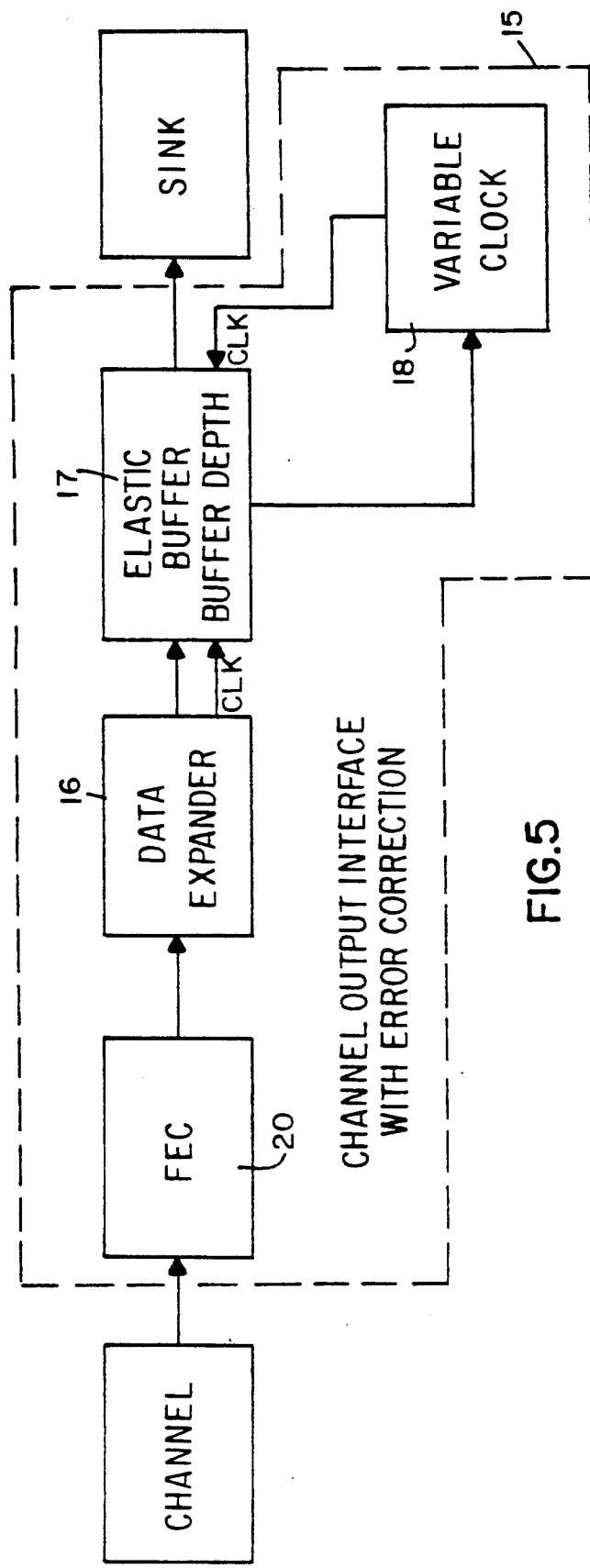
FIG. 5 is a block diagram of an error correcting implementation at the channel output interface.

FIG. 4 shows a block diagram of channel input interface 13 with FEC 19 which is a forward error correction circuit. FIG. 5 shows a block diagram of channel output interface 15 with FEC 19 which is a forward error correction circuit. This arrangement requires additional bandwidth overhead that is dependent on the error correction method selected. The Reed-Solomon error correction method typically requires low overhead and is particularly effective when burst error conditions exist. In case of errors when retransmission is a viable option, a simple CRC test is sufficient to determine whether a retransmission is required. CRC requires minimal bandwidth overhead and is easy to implement.

The preferred embodiment of the the invention and best mode of practicing the invention have been disclosed. The scope of the invention is not defined by the examples given. for example, the invention is not restricted to data payload. When the application is forgiving and error tolerant, lossy, i.e. noisy, compression algorithms may be employed. According the scope of the invention is determined by the claims.

What is claimed is:

1. Method of transferring isochronous data having a data rate from a source over a clocked channel having a traffic rate to a destination comprising the steps of:
   compressing said data by a compression ratio responsive to a depth of a first variable stack;
   storing compressed data in said first variable stack;
   clocking said first variable stack by said channel at said traffic rate;
   expanding compressed data from said channel;
   storing expanded data in a second variable stack; and
   clocking said second variable stack at a clock rate to maintain said second variable stack at a constant depth, said clock rate equal to said data rate.

* * * * *